United States Patent
Gaynes et al.

(10) Patent No.: US 9,231,139 B2
(45) Date of Patent: Jan. 5, 2016

(54) STRUCTURE AND DESIGN OF CONCENTRATOR SOLAR CELL ASSEMBLY RECEIVER SUBSTRATE

(75) Inventors: Michael A. Gaynes, Vestal, NY (US); Yves C. Martin, Ossining, NY (US); Jay E. Pogemiller, New Paltz, NY (US); Aparna Prabhakar, North White Plains, NY (US); Theodore G. van Kessel, Millbrook, NY (US); Brent A. Wacaser, Garrison, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 928 days.

(21) Appl. No.: 13/249,686

(22) Filed: Sep. 30, 2011

(65) Prior Publication Data

US 2012/0138145 A1 Jun. 7, 2012

Related U.S. Application Data

(60) Provisional application No. 61/388,475, filed on Sep. 30, 2010.

(51) Int. Cl.
*H01L 31/0232* (2014.01)
*H01L 31/052* (2014.01)
*H01L 31/02* (2006.01)
*H01L 31/054* (2014.01)

(52) U.S. Cl.
CPC ........ *H01L 31/052* (2013.01); *H01L 31/02008* (2013.01); *H01L 31/0521* (2013.01); *H01L 31/0543* (2014.12); *Y02E 10/52* (2013.01)

(58) Field of Classification Search
CPC ............ H01L 31/02008; H01L 31/052; H01L 31/0543; H01L 31/0521
See application file for complete search history.

(56) References Cited

U.S. PATENT DOCUMENTS

| | | | | |
|---|---|---|---|---|
| 4,612,409 A * | 9/1986 | Hamakawa et al. | ........... | 136/244 |
| 6,399,874 B1 * | 6/2002 | Olah | ............................. | 136/259 |
| 6,653,551 B2 * | 11/2003 | Chen | ................... | H01L 31/0547 126/643 |
| 8,941,000 B2 * | 1/2015 | Martin | ................ | H01L 31/0521 136/246 |
| 2004/0031517 A1 | 2/2004 | Bareis | | |
| 2005/0091979 A1 | 5/2005 | Bareis | | |
| 2009/0140406 A1 | 6/2009 | Horne | | |
| 2011/0168247 A1 | 7/2011 | Guha | | |

* cited by examiner

*Primary Examiner* — Golam Mowla
(74) *Attorney, Agent, or Firm* — Louis J. Percello; Otterstedt, Ellenbogen & Kammer, LLP

(57) ABSTRACT

A substrate has a top side and a bottom side. A solar cell is secured to the top side of the substrate and has an anode and a cathode. A heat transfer element is secured to the bottom side of the substrate. An anode pad is formed on the top side of the substrate and is coupled to the anode of the solar cell; similarly, a cathode pad is formed on the top side of the substrate and is coupled to the cathode of the solar cell. The substrate coefficient of thermal expansion and the solar cell coefficient of thermal expansion match within plus or minus ten parts per million per degree C.

22 Claims, 3 Drawing Sheets

STRUCTURE AND DESIGN OF CONCENTRATOR SOLAR CELL ASSEMBLY RECEIVER SUBSTRATE

CROSS-REFERENCE TO RELATED APPLICATIONS

This patent application claims the benefit of U.S. Provisional Patent Application Ser. No. 61/388,475 filed on Sep. 30, 2010, and entitled "Structure and Design of Concentrator Solar Cell Assembly Receiver Substrate." The disclosure of the aforementioned Provisional Patent Application Ser. No. 61/388,475 is expressly incorporated herein by reference in its entirety for all purposes.

FIELD OF THE INVENTION

The present invention relates to solar concentrators, and, more particularly, to solar concentrators comprising materials such as III-V semiconductor materials and the like.

BACKGROUND OF THE INVENTION

Solar concentrators operate by focusing light to a spot on a photovoltaic cell. The concentrated spot of light enables a small semiconductor to operate at higher power density levels than in flat panels without concentration. A consequence of the use of concentration is that the photovoltaic cell produces electric power at high current and with a significant heat load.

The solar concentrator package typically includes three main components, namely optical assembly, photovoltaic assembly and cooling assembly. The optical assembly concentrates sunlight and conveys it to the active portion of the photovoltaic assembly (solar cell). The photovoltaic cell converts a portion of the incident light to electricity.

The photovoltaic assembly electrically connects the photovoltaic cell to other circuitry and ultimately to the point of use. The photovoltaic assembly also supports the cell and couples it to the cooling assembly. The cooling assembly conveys heat from the cell to the environment. The solar cell package in general includes the solar cell and solar cell receiver (or package) assembly.

The solar cell may comprise a single junction semiconductor or a multifunction semiconductor.

SUMMARY OF THE INVENTION

Principles of the invention provide structures and designs pertaining to concentrator solar cell assembly receiver substrates. In one aspect, an exemplary apparatus includes a substrate having a top side and a bottom side; a solar cell secured to the top side of the substrate and having an anode and a cathode; a heat transfer element secured to the bottom side of the substrate; an anode pad formed on the top side of the substrate and coupled to the anode of the solar cell; and a cathode pad formed on the top side of the substrate and coupled to the cathode of the solar cell. The substrate has a substrate coefficient of thermal expansion, the solar cell has a solar cell coefficient of thermal expansion, and the substrate coefficient of thermal expansion and the solar cell coefficient of thermal expansion match within plus or minus ten parts per million per degree C.

In another aspect, an exemplary system includes a concentrating lens; and an assembly which in turn includes a substrate having a top side and a bottom side; a solar cell secured to the top side of the substrate; a heat transfer element secured to the bottom side of the substrate; an anode formed on the top side of the substrate and coupled to the solar cell; and a cathode formed on the top side of the substrate and coupled to the solar cell. The substrate has a substrate coefficient of thermal expansion, the solar cell has a solar cell coefficient of thermal expansion, and the substrate coefficient of thermal expansion and the solar cell coefficient of thermal expansion match within plus or minus ten parts per million per degree C. Furthermore, the assembly and the concentrating lens are cooperatively configured so as to focus solar radiation on the solar cell.

As used herein, "facilitating" an action includes performing the action, making the action easier, helping to carry the action out, or causing the action to be performed. Thus, by way of example and not limitation, instructions executing on one processor might facilitate an action carried out by a piece of manufacturing or test equipment or instructions executing on a remote processor, by sending appropriate data or commands to cause or aid the action to be performed. For the avoidance of doubt, where an actor facilitates an action by other than performing the action, the action is nevertheless performed by some entity or combination of entities.

Techniques of the present invention can provide substantial beneficial technical effects. For example, one or more embodiments may provide one or more of the following advantages:

reduce or eliminate mismatch of the thermal coefficients of expansion (TCE) between the chip and substrate effectively handle high conduction of heat and/or current from the chip;

reduce or prevent corrosion at thermal and/or electrical connections;

provide a mechanically stable, flat support for the semiconductor device.

These and other features and advantages of the present invention will become apparent from the following detailed description of illustrative embodiments thereof, which is to be read in connection with the accompanying drawings.

DETAILED DESCRIPTION OF PREFERRED EMBODIMENTS

Figure 1:
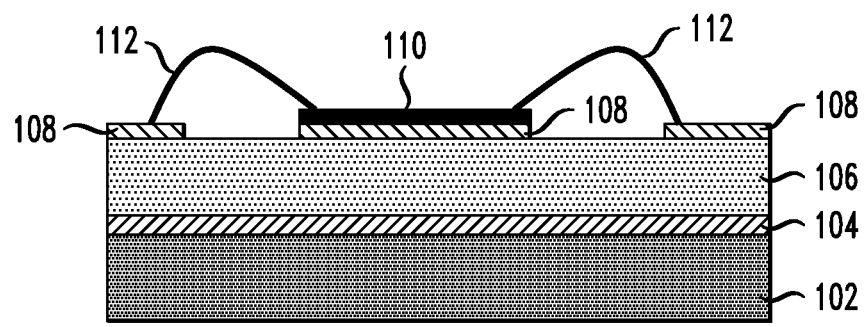
FIG. 1 shows a solar cell receiver package including photovoltaic (PV) cell, electrically insulating and thermally conductive substrate with CTE <10 ppm per degree, isolated top and bottom parts, and separate anode and cathode, and affixed on a heat transfer element using a thermal interface, according to an aspect of the invention.

As noted, solar concentrators operate by focusing light to a spot on a photovoltaic cell. The concentrated spot of light enables a small semiconductor to operate at higher power density levels than would be possible in flat panels without concentration. A consequence of the use of concentration is that the photovoltaic cell produces electric power at high current and with a significant heat load.

As also noted, the solar concentrator package typically includes three main components, namely optical packaging, solar cell packaging and cooling packaging. The solar cell package in general includes the solar cell and solar cell receiver package assembly.

One presently preferred but non-limiting exemplary embodiment comprises a triple junction solar cell based on a germanium bulk semiconductor affixed to an aluminum nitride substrate using a solder thermal interface. The aluminum nitride substrate is further thermally connected to a heat sink device using a liquid metal interface. A patterned copper metal layer is applied to the chip side of the aluminum nitride substrate. This copper layer is itself a multilayer film including a titanium under layer that provides adhesion between the copper and the aluminum nitride substrate. The patterned copper layer is further capped with a thin gold layer to prevent oxidation of the copper and improve wetting of the solder. The gold layer is purposely made thin in the area between the cell and the substrate to limit intermetallic formation and embrittlement of the solder that is reflowed between. A presently preferred but non-limiting exemplary solder metal interface is lead tin. The back side of the aluminum nitride substrate is further coated with a titanium gold layer to provide an oxide free wetting layer for the liquid metal thermal interface. A presently preferred but non-limiting exemplary liquid metal that comprises this interface includes gallium indium tin eutectic.

One or more embodiments advantageously integrate the solar cell receiver, solar cell and the cooling elements of the solar concentrator to ensure appropriate dissipation of generated heat load. Furthermore, one or more embodiments advantageously provide receiver package substrate structure(s) which facilitate proper disposition of the solar cell and allow for enhanced and even optimum heat dissipation, while reliably allowing the required electrical connections to be made. In one or more embodiments, the receiver substrate provides an appropriate platform for environmental protection, heat dissipation, electrical connectivity and/or other functions to the solar cell.

One or more embodiments address multi junction photovoltaic cells operating at high concentrations.

Co-assigned US Patent Publication 2011-0168247 of Guha et al. entitled Techniques for Cooling Solar Concentrator Devices, the complete disclosure of which is expressly incorporated herein by reference in its entirety for all purposes, describes exemplary methodology used for cooling at >1000 sun concentrations.

In one or more embodiments, the structure and the design of the solar receiver substrate in a concentrated solar cell assembly allow for the integration of the lead and/or interposer connector, the solar cell, the thermal interface material and the heat transfer element.

In one or more instances, multi-layer, multi-level metallization allows for the lead frame and/or interposer connector, and the solar cells, to be connected as per the individual requirements of heat dissipation, electrical connectivity and/or other functions. The anode and cathode can be patterned with conductor, as per appropriate requirements, to address connections to the solar cell 110 and connectors 328, as discussed further below with respect to FIGS. 3 and 4. Suitable connection techniques include wire bonding or strap bonding.

Figure 2:
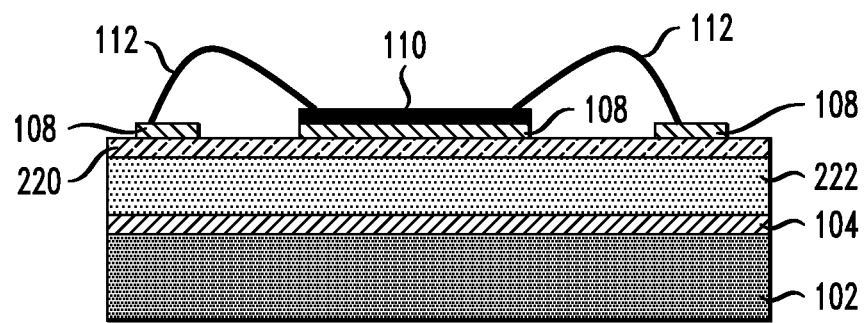
FIG. 2 shows a solar cell receiver package including PV cell, an electrically conducting substrate with CTE <10 ppm per degree coated with an insulator with closely matched CTE, isolated top and bottom parts, and separate anode and cathode, according to an aspect of the invention.

FIGS. 1 and 2 illustrate side views of exemplary receiver substrate structures and designs. In one or more embodiments, the starting material of the receiver substrate is a material whose coefficient of thermal expansion (CTE) is closely matched to the CTE of the solar cell which needs to be attached; in at least some instances, within +/−10 parts per million (ppm) per degree Centigrade.

Unless otherwise stated, metric units will be used herein, including degrees Centigrade for temperature.

A presently preferred but non-limiting exemplary substrate is an insulator, as shown at 106 in FIG. 1; or, in an alternative embodiment, a conducting material, as shown at 222 in FIG. 2. In the latter case, the top and bottom surfaces of the substrate 222 are electrically isolated, by insulating material 220 on the top and optionally by an insulating layer on the bottom of 222 (not shown to avoid clutter). Common materials used to provide insulation include but are not limited to coatings comprising epoxy and polyimide based materials. A commercial material that we have found practical is Techniflex made by Technic, Inc., Cranston, R.I., USA. In either case, backside metallization can be provided on the back side of substrate 106, 222 where the substrate interfaces with the heat transfer element 102 via the thermal interface 104. Exemplary heat transfer elements 102 are discussed further below.

Heat is conveyed from the package substrate 106 to the heat transfer element 102 via the thermal interface 104. The thermal interface may comprise a variety of materials including but not limited to a liquid thermal interface, particle impregnated polymer paste, polymer adhesives and gels, and a solder thermal interface. Backside (i.e., side adjacent 104) metallization on the substrate and topside (i.e., side adjacent 104) metallization on the heat sink are preferably employed where a liquid metal thermal interface 104 is employed, so as to ensure good wetting (sometimes also referred to as adhesion).

Furthermore, in each case a layer of conducting material 108 is formed on the top of substrate 106 or on the insulated layer 220 on top of substrate 222. Such layer is insulator substrate 106, patterned to form a portion underneath the solar cell 110 and anodes and/or cathodes for the solar cell as shown under leads (connections) 112.

Thus, in one or more embodiments, the receiver substrate 106 or 222 with layer 220 is further designed and metalized in such a way that there is a separate anode and cathode to make electrical connections to the solar cell (e.g., portions of layer 108 under leads 112). The metallurgy for the receiver substrate is selected depending on the methodology used to connect the solar cell 110 to the receiver substrate (106 or 222 with layer 220) and further in the case where the thermal interface 104 is a solder of liquid metal thermal interface. In the case of solder attach in particular, it is desirable that the solder does not become brittle after attachment due to the formation of intermetallics; inasmuch as such embrittlement can lead to various reliability issues.

In the case of a liquid metal thermal interface, the gold dissolves into the liquid metal alloy and it is desirable to minimize the amount such that the eutectic properties of the alloy are not significantly altered. Hence, the metallization of the anode and cathode for making connections with the solar cell 110 is preferably specific in terms of thickness and material.

Furthermore in this regard, a non-limiting example includes the use of gold. Photovoltaic cells are typically affixed to a substrate using solder or an adhesive impregnated with conductive particles such as silver. Gold is commonly used as a terminal metal to prevent oxidation of underlying metal particularly if solder is to be used as a joining material. If solder is to be used a thin layer of gold is recommended to avoid forming solder intermetallics during reflow that embrittle the solder. In the case where lead tin solder is used, restricting the thickness of gold to 1000 angstroms will reduce the embrittlement of the solder joint. One embodiment of a solder thermal interface comprises a layer of chrome capped with a layer of gold on the ceramic substrate, with a corresponding layer of gold on the opposing face of a copper heat sink. Lead tin solder is reflowed between the two to form the complete interface. Another embodiment comprises a titanium layer capped with a gold layer on the ceramic substrate and a titanium layer capped with a gold layer on the adjoining heat sink copper surface with a gallium indium tin eutectic liquid metal interface between to form the complete thermal interface 104.

Accordingly, FIG. 1 shows a solar cell receiver package including isolated top and bottom parts, and separate anode and cathode (portions of layer 108 under leads 112); furthermore. FIG. 2 shows a solar cell receiver package including a conducting substrate 222 coated with an insulator 220 with closely matched CTE, isolated top and bottom parts, and separate anode and cathode (portions of layer 108 under leads 112).

Figure 7:
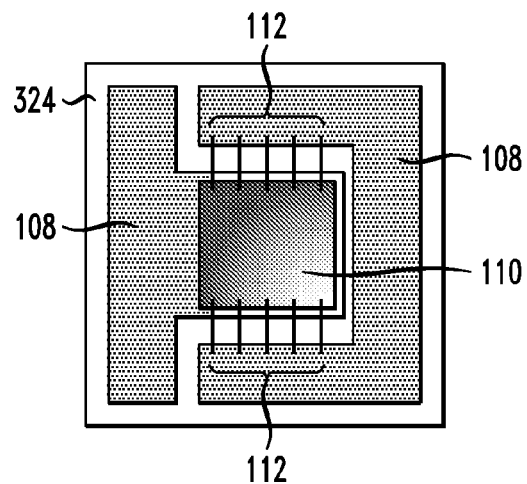
FIG. 7 shows an exemplary top view illustration of a package in accordance with an aspect of the invention.

FIG. 7 shows an exemplary top view. Substrate 324 is generally representative of substrate 106 or substrate 222 with layer 220. The metallization 108 is also generally representative of metallization 308, 408 discussed below. One portion (left-hand "T" shape") of the metallization underlies photovoltaic cell 110 while another portion (right-hand "C" shape) is isolated from the first portion. Wire bonds 112 connect the cell to this second portion. Leads 328, discussed below, are omitted from FIG. 7 to avoid clutter. Reference is made to the discussion below of the chip anode and cathode; anode and cathode pads on the package; and pads for the external leads.

Figure 3:
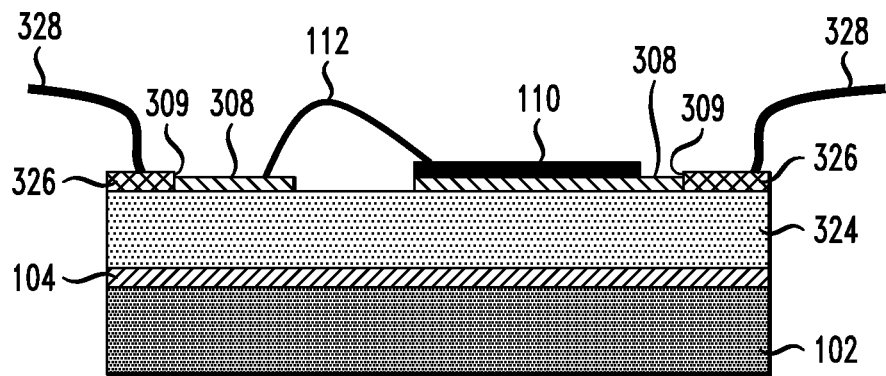
FIG. 3 shows a solar cell receiver substrate, with interconnects and solar cell sharing anode and cathode and having different thickness of metallization with similar metals, according to an aspect of the invention.
Figure 4:
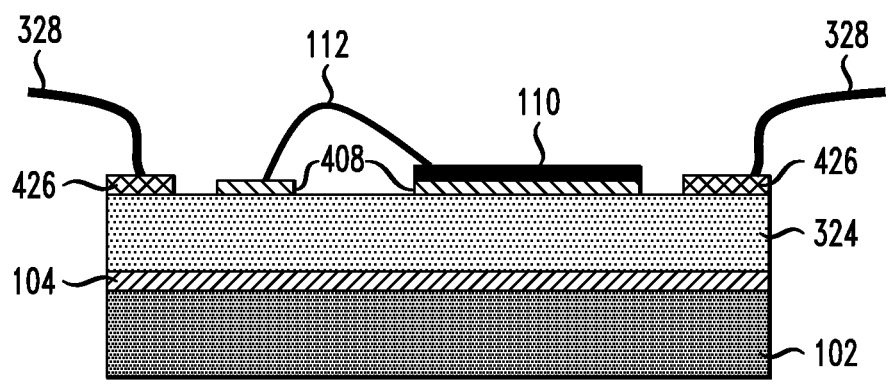
FIG. 4 shows a solar cell receiver substrate, with interconnects and solar cell each with its own anode and cathode, with appropriate metal thicknesses and composition (similar or different), according to an aspect of the invention.

FIGS. 3 and 4 illustrate exemplary integration of connectors (for lead frame and/or interposer) and the solar cell onto the receiver substrate (designated generally as 324 which is, as noted, representative of substrate 106 or substrate 222 with layer 220). Elements 102, 104, 110 are similar to those in FIGS. 1 and 2. In some instances, for connecting lead frame and/or interposer connectors 328 on the receiver package, the metallization of the fingers of the lead frame and/or interposer connector 326 should be similar to the connecting anode and cathode pads (formed from layer 308 under lead 112). To ensure longevity of the connections and protection against environmental issues, it may be desirable to have an anti-corrosion coating on both the fingers 326 and the part of the anode/cathode layer 308 making contact with the connectors (i.e., near interface 309). In one embodiment this coating comprises gold. In alternate embodiments this coating comprises silver or tin.

Thus, in some instances (e.g., FIG. 3), it may be desirable to have multi-thickness, multi-layer metallization on the receiver substrate which will allow for making connections with both the solar cell and the connectors at the same time; that is, layer 308 is used to make the anode and cathode for connection with the solar cell 110 and portions 326, which have a different thickness but similar metallization, are used to connect with lead frame and/or interposer connectors 328. An exemplary embodiment of this includes a terminal metallization of the anode and cathode that is thick in regions not intended to form a part of the aforementioned solder interface to allow wire bonding to be performed. In such cases additional thickness of several thousand angstroms of gold may be added.

FIG. 3 thus shows a solar cell receiver substrate 324, with the interconnects 328 and the solar cell 110 sharing anode and cathode (layer 308 abutting layer 326) and having different thickness of metallization with conductive materials forming an electrical connection. In most embodiments, the materials are the same materials but with different thicknesses as mentioned above. In alternate embodiments there may be a material transition between 308 and 309. An exemplary embodiment includes a transition from copper to silver.

FIG. 4 shows a solar cell receiver substrate 324, with the interconnects 328 and solar cell 110 each with its own anode and cathode (layer 408 or layer 426 as the case may be), with appropriate metal thicknesses and composition (similar or different). Note layer 408 forming a region to receive solar cell 110 as well as a pad under lead 112, generally representing an anode or cathode for cell 110. Note also layer 426 forming an anode and cathode under interconnects 328.

In each case, the top side of the receiver substrate 324 has been patterned and appropriately metalized to form anodes and cathodes, whereas the bottom side is in thermal contact with the heat transfer element 102.

Figure 5:
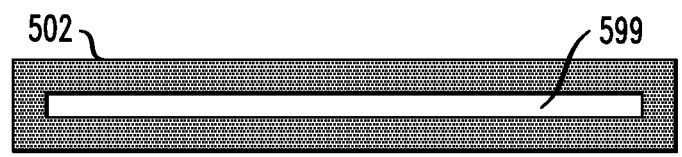
FIG. 5 depicts a fluid-filled heat exchanger, useful in one or more embodiments of the invention.

FIG. 5 shows a fluid-filled heat exchanger 502 having a cavity 599 filled with a heat transfer fluid, and is generally representative of a vapor chamber, heat pipe, or fluid heat exchanger such as an air-cooled cold plate or liquid-cooled cold plate. Cavity 599 can also include fins, a wicking structure, surface enhancements to promote boiling, and the like.

For the avoidance of doubt, note again that leads or connectors 112 are from the solar cell 110 to its anode and cathode (whether shared with lead frame and/or interposer connectors or individual) while leads or connections 328 are lead frame and/or interposer connectors.

With regard to the substrate, in one or more embodiments it is formed with a material with predetermined CTE such that it is closely matched to the CTE of the attached solar cell 110 (in at least some instances, within +/−10 ppm per degree C.). Furthermore, in one or more embodiments, a separate anode and cathode are provided on top of the substrate for establishing electrical connections. In some instances, the solar cell receiver substrate is an insulating substrate 106 with CTE <10 ppm per degree, and is formed from Aluminum Nitride, Alumina, Silicon Nitride, Silicon Dioxide, and/or other insulating materials with the given CTE. In other instances, the solar cell receiver substrate 222 is formed from an electrically conducting material, preferably with CTE such that it is closely matched to the CTE of the attached solar cell 110 (in at least some instances, +/−10 ppm per degree C.). Conducting substrates can be coated on top by an insulating material 220 with acceptable dielectric breakdown strength. Such a coating can be formed, for example, by sputtering, spinning, spraying or evaporation.

In some cases, the solar cell receiver substrate is selected from the group consisting of Aluminum Nitride, Alumina, Silicon Nitride, Silicon Dioxide, and/or other insulating materials.

In one or more embodiments, as depicted in the figures, the substrate 106, 222, 324 is effectively part of the heat transfer element 102; the latter can be, for example, a vapor chamber, heat pipe, liquid vapor heat exchanger, or the like. These devices are used to spread the heat load further and are typically attached or connected to a finned heat sink from which heat is finally transferred to the environment. Conducting (e.g., metallic) substrates 222 may be particularly useful as portions of heat transfer elements especially when the same constitute pressure vessels.

In one or more embodiments, the solar cell receiver substrate has a thermal conductivity >50 W/m-K; in at least some instances, it may also have a CTE such that it is closely matched to the CTE of the attached solar cell 110 (for example, +/−10 ppm per degree C.).

With regard to the definition of the electrical connections and/or metallization of the substrate surface, in one or more embodiments, the anode, cathode and those patterned elements directly connected to the anode or cathode are electrically isolated from the heat sink element. In the configuration illustrated in FIG. 1, the substrate comprises an insulator and provides the electrical isolation. In the configuration illustrated in FIG. 2, the isolating material 220 provides this isolation. Furthermore, in at least some cases, the adhesion material for the metal layer 108 includes one or more of chromium, copper, nickel, tantalum, titanium, and alloys thereof. In some cases, the adhesion material for the metal layer is selected from the group consisting of chromium, copper, nickel, tantalum, titanium, and alloys thereof.

With regard to the bottom side of the substrate, in some instances, the bottom side is coated with a continuous conducting metal layer to balance stress or provide a wetting layer in the case where 104 is a liquid or solder thermal interface. In cases where a polymeric thermal interface 104 is used the backside of substrate 106 may be coated with an adhesion promoting layer. Epoxy films are an example.

Non-limiting examples of suitable materials for a backside conducting layer on 106 include a metallization, such as a multi-layer metallization of one or more of Au, Cu, Invar, Mo, Stainless steel, brass, chromium, copper, nickel, tantalum, tungsten, titanium, or alloys thereof. In some cases, such as where the material for layer 104 is a liquid thermal interface material, Au or another noble metal resistant to oxide formation can be employed to coat the backside metallization.

In some cases, the continuous back side conducting layer comprises a material selected from the group consisting of Au, Cu, Invar, Mo, Stainless steel, brass, chromium, copper, nickel, tantalum, tungsten, titanium, or alloys thereof.

In one or more embodiments, the substrate is formed with a medium 104 in direct contact and providing an integrated part of the heat sink 102. An embodiment of this would include a coating of metallic particles, nano particles or other wicking material such that when bonded with heat sink element 102 a vapor chamber is formed. In a further embodiment element 104 comprises liquid cooling channels bonded to the substrate 106 and heat sink element 102 thereby forming a fluid heat exchanger. In some cases, the bottom side of the substrate can be processed to enhance or even optimize any one, some, or all of nucleate boiling, wicking, and vaporization of liquid. This can be achieved, for example, by spraying nano- or micro-material on the bottom of the substrate.

With regard to the anode and cathode for making electrical connections, in one or more embodiments, anode and cathode contact pads (e.g., in layers 108, 308, 408) are provided for solar cell connection. Furthermore, in one or more embodiments, anode and cathode contact pads (e.g., 326, 426, 541, 543) are provided for interposer connectors and/or lead frame connectors 328. In some instances, as seen, for example, in FIG. 4, there are separate anode and cathode contact pads for (i) solar cell connection (e.g., 408) and (ii) interposer connector or lead frame connector (e.g., 426).

In one or more embodiments (e.g., FIGS. 1-4), the anode and cathode contact pads are on the same side of the substrate. In the non-limiting example of those figures, they are on the top, but they could also be located on the bottom if desired. In other instances (e.g., FIG. 5), the anode and cathode contact pads are on different sides of the substrate (i.e. one 541 on the top side and the other 543 on the bottom side).

With respect to metallization of the anode and cathode, in one or more embodiments, the metal layer for the anode and/or cathode can include a multi-layer metallization of one or more of Au, Cu, Invar, Mo, Stainless steel, brass, chromium, copper, nickel, tantalum, titanium, or alloys thereof. In one or more embodiments, the top (i.e., exposed) level of metallization of the anode and/or cathode contact pads is made of one or more of Au, Cu, Invar, Mo, Ag, brass and alloys thereof.

In some cases, the metal layer for the anode and/or cathode comprises a material selected from the group consisting of Au, Cu, Invar, Mo, Stainless steel, brass, chromium, copper, nickel, tantalum, titanium, or alloys thereof. In some cases, the top (i.e., exposed) level of metallization of the anode and/or cathode contact pads comprises a material selected from the group consisting of Au, Cu, Invar, Mo, Ag, brass and alloys thereof.

In some instances, such as, for example, FIGS. 3 and 4, the anode and cathode contact pad metallization is different for the solar cell connection and the interposer or lead frame connector. Non-limiting examples of differences include differences in multi-layer structures, different types of metallization, and the like. This can be achieved, for example, by a including a plurality of metal surfaces by any one or more of plating, sputtering, spinning, spraying, evaporation, and the like.

In one or more embodiments, the anode and cathode contact pad top layer metallization for solar cell connection 108, 308, 408 is Au and is defined by the method of solar cell attachment such that the thickness of Au does not allow for embrittlement i.e. less than 2% by weight of solar cell attach material (in case of Eutectic solder). It will be appreciated that gold advantageously protects copper from oxidation and leaves an oxide-free place for application of solder; the gold will readily alloy with the solder material. However, if excessive amounts of gold are employed, the properties of the solder will be changed and the solder will be embrittled. Small amounts of gold, on the order of a few thousands Angstroms, generally prevent oxide formation and allow the solder to flow without flux but do not cause trouble in terms of embrittlement.

Furthermore, in some cases, such as FIGS. 3 and 4, the anode and cathode contact pad metallization has different metal thicknesses for the solar cell connection 308, 408 and the interposer connector or lead frame connector, as shown at 326, 426. This can be achieved, for example, by multi-level metallization. In one or more embodiments, the anode and cathode contact pads 326, 426, 541, 543 for the interposer or lead frame connectors have a coating of anti-corrosion lubricant (lubricant film not amenable to illustration).

Note that in some cases, the anode and cathode contact pads have the same metallurgy as the metallurgy of the interposer and/or lead frame connectors to prevent corrosion. The preferred contact material is gold, but alternatives include but are not limited to silver, tin, chrome, nickel, vanadium, cobalt and alloys thereof.

The anode and cathode contact pads for the solar cell 110 and for the interposer and/or lead frame connectors can be defined, for example, by utilization of one or more of a lithographic process, micro fabrication processes, a process utilizing metal masks, plating, spinning, spraying, evaporation, and the like.

One or more embodiments of the invention thus address the attachment of a semiconductor (e.g. photovoltaic, high current switch) chip on a substrate in environments of high heat, high temperature, and significant changes in heat flux and/or temperature. One or more embodiments advantageously reduce or eliminate mismatch of the thermal coefficients of expansion (TCE) between the chip and substrate; effectively address high conduction of heat and/or current from the chip; and/or reduce or prevent corrosion at thermal and/or electrical connections.

Figure 6:
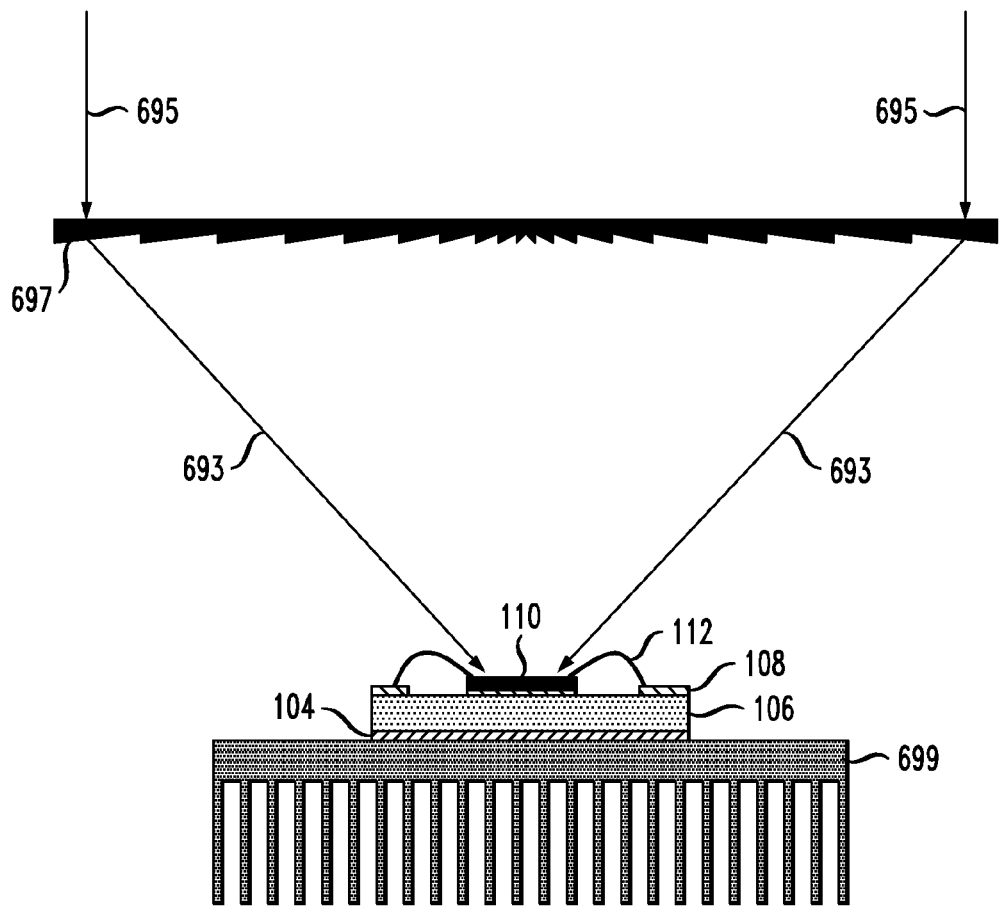
FIG. 6 depicts a higher assembly including a concentrating lens, photovoltaic cell, package, and heat sink showing the path of solar illumination and how the package fits into the overall solar concentrator, according to an aspect of the invention.

Referring now also to FIG. 6, heat transfer element 102 comprises any heat exchange device that spreads and conveys heat sourced in the photovoltaic to the ambient environment directly or indirectly. A simple and familiar example of a heat transfer element would include a finned aluminum plate 699 in which heat spreads in the aluminum plate and conducts to the fins and finally transfers to the air via convection. More involved examples include the use of vapor chamber heat sinks, and liquid cold plates. In the case of a liquid cold plate, a working fluid (usually water) is circulated through the cold plate and used to transfer heat from the liquid cold plate heat exchanger to a secondary heat exchanger. The secondary heat exchanger then typically transfers the heat to the environment (usually air). A familiar example is the radiator in a car. Finally, refrigerated cold plates may be used to enable operation of the photovoltaic near or even below ambient temperatures.

Note concentrating lens 697 which focuses parallel solar rays 695 onto photovoltaic cell 110, as at 693. The package elements are as described above. As noted, finned aluminum plate 699 is one form of heat sink.

Embodiments of the invention can be employed with a variety of solar cells 110.

Exemplary materials for conducting substrate 222 include aluminum nitride (AlN); sapphire or other form of aluminum oxide ($Al_2O_3$); titanium carbide (TiC); and the like. Aluminum nitride is presently preferred.

Leads 112, 328 may be formed, for example, from copper, gold, silver, and alloys thereof.

Given the discussion thus far, it will be appreciated that, in general terms, an exemplary apparatus includes a substrate 106, 222, 324 having a top side and a bottom side; a solar cell 110 secured to the top side of the substrate and having an anode and a cathode (end points of leads 112 on cell 110); and a heat transfer element 102, 502, 699 secured to the bottom side of the substrate. Also included are an anode pad 108, 308, 408 formed on the top side of the substrate and coupled to the anode of the solar cell; and a cathode pad 108, 308, 408 formed on the top side of the substrate and coupled to the cathode of the solar cell. Elements 108, 308, 408 are equally representative of anode pads and cathode pads. The substrate has a substrate coefficient of thermal expansion, the solar cell has a solar cell coefficient of thermal expansion, and the substrate coefficient of thermal expansion and the solar cell coefficient of thermal expansion match within plus or minus ten parts per million per degree C.

In some cases, the substrate 106 includes an electrically insulating material (non-limiting examples include one or more of aluminum nitride, alumina, silicon nitride, an organic polymer, a particle-impregnated organic polymer, epoxy resin, and silicon dioxide).

In one or more embodiments, the substrate coefficient of thermal expansion is less than ten parts per million per degree C.

In one or more instances, the substrate has a thermal conductivity greater than 50 W/m-K.

A variety of heat transfer elements can be employed; for example, a plate heat sink (102 is illustrative); a finned plate heat exchanger (699 is illustrative); a vapor chamber; a heat pipe; and/or a fluid heat exchanger such as a liquid cold plate or air cold plate (502 is illustrative of the vapor chamber, heat pipe, or fluid heat exchanger).

Given the teachings herein, the skilled artisan can pick wicking materials for a heat pipe, surface enhancements for nucleate boiling, and so on.

One or more embodiments further include at least one contact pad 309, 426 for at least one of a lead frame connector and an interposer connector 328. The at least one contact pad is formed on the top side of the substrate. It is worth noting, for the avoidance of confusion, that in a particular form of triple-junction solar cell 110, the bottom of cell has the cell anode, and the top of the cell has the cell cathode. Other embodiments could be different depending on the technology used in the cell; for example, cell anode and cathode both on top; cell anode and cathode both on bottom; or cell anode on top and cell cathode on bottom. Multiple wires 112 typically come out of the cell; in some embodiments, wires 112 are all at the same voltage and the other part comes out bottom. In general, there is a need to run leads from the chip to the package, and then from the package to the "rest of the world." Since the chip is typically very delicate and needs strain relief, a large number of tiny wire-bonded wires such as 112 run from the from chip to another pad 108, 308, 408. Then, an external connection is provided from such pad to the outside world-line 328 is such an external connection. This is why line 328 is depicted as thicker in the figures, although this need not necessarily be the case in all embodiments. In FIG. 1, the anode and cathode pads can extend beyond the cell in some cases. One or more pads can be provided.

For the avoidance of doubt, the anode and cathode pads may in some instances be loosely referred to herein as simply anode and cathode. The skilled artisan will appreciate from the context whether the chip anode and cathode; anode and cathode pads on the package; or pads for the external leads are intended.

In some cases, the at least one contact pad 309, 426 has a different metallization than the anode pad and the cathode pad; in other cases, the at least one contact pad 309, 426 has metallization identical to that of the anode pad and the cathode pad.

In some cases, the at least one contact pad 309, 426 has a different thickness than the anode pad and the cathode pad 308, 408.

In one or more embodiments, an anti-corrosion lubricant is located on at least a portion of the at least one contact pad 309, 426.

In some cases, the substrate 222 includes an electrically conductive material with an electrically insulating layer 220 thereon. The electrically insulating layer forms the top side of the substrate.

One or more embodiments include a thermal interface 104 between the heat transfer element and the substrate; for example, a liquid metal thermal interface, in which case adjacent portions of the heat transfer element and the substrate are preferably metalized to provide wetting for the liquid metal thermal interface.

Furthermore, given the discussion thus far, it will be appreciated that, in general terms, an exemplary system includes a concentrating lens 697; and an assembly which in turn includes a substrate 106, 222, 324 having a top side and a bottom side; a solar cell 110 secured to the top side of the substrate; a heat transfer element 699 (but other types represented by 102, 502 could also be used) secured to the bottom side of the substrate; an anode pad 108, 308, 408 formed on the top side of the substrate and coupled to the solar cell; and a cathode pad 108, 308, 408 formed on the top side of the substrate and coupled to the solar cell.

The substrate has a substrate coefficient of thermal expansion, the solar cell has a solar cell coefficient of thermal expansion, and the substrate coefficient of thermal expansion and the solar cell coefficient of thermal expansion match within plus or minus ten parts per million per degree C. Furthermore, the assembly and the concentrating lens are cooperatively configured so as to focus solar radiation on the solar cell.

In some instances, the substrate 106 includes an electrically insulating material (by way of example and not limitation, aluminum nitride, alumina, silicon nitride, an organic polymer, a particle-impregnated organic polymer, epoxy resin, and/or silicon dioxide).

In some cases, the substrate coefficient of thermal expansion is less than ten parts per million per degree C.

In one or more embodiments, the substrate has a thermal conductivity greater than 50 W/m-K.

In some instances, the substrate 222 includes an electrically conductive material with an electrically insulating layer 220 thereon, and the electrically insulating layer forms the top side of the substrate.

Some embodiments include a thermal interface 104 between the heat transfer element and the substrate: in some cases, the thermal interface 104 includes a liquid metal thermal interface, in which case adjacent portions of the heat transfer element and the substrate are preferably metalized to provide wetting for the liquid metal thermal interface.

One or more methods, techniques, and/or processes as described above can be used, for example, in the fabrication of products such as solar cells and the like.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. An apparatus comprising;
   a mechanically stable flat substrate having a top side and a bottom side;
   a metallization layer formed on said top side of said mechanically stable flat substrate;
   a solar cell attached to said top side of said mechanically stable flat substrate via said metallization layer and having an anode and a cathode;
   a heat transfer element secured to said bottom side of said mechanically stable flat substrate;
   an anode pad formed on said top side of said mechanically stable flat substrate as part of said metallization layer and coupled to said anode of said solar cell; and
   a cathode pad formed on said top side of said mechanically stable flat substrate as part of said metallization layer and coupled to said cathode of said solar cell;
   wherein said mechanically stable flat substrate has a substrate coefficient of thermal expansion, said solar cell has a solar cell coefficient of thermal expansion, and said substrate coefficient of thermal expansion and said solar cell coefficient of thermal expansion match within plus or minus ten parts per million per degree C.

2. The apparatus of claim 1, wherein said mechanically stable flat substrate comprises an electrically insulating material.

3. The apparatus of claim 2, wherein said substrate coefficient of thermal expansion is less than ten parts per million per degree C.

4. The apparatus of claim 3, wherein said electrically insulating material comprises at least one of aluminum nitride, alumina, silicon nitride, an organic polymer, a particle-impregnated organic polymer, epoxy resin, and silicon dioxide.

5. The apparatus of claim 1, wherein said mechanically stable flat substrate has a thermal conductivity greater than 50 W/m-K.

6. The apparatus of claim 1, wherein said heat transfer element 102 coupled to said mechanically stable flat substrate comprises at least one of:
   a vapor chamber;
   a heat pipe; and
   a fluid heat exchanger.

7. The apparatus of claim 1, further comprising at least one contact pad 309, 426 for at least one of a lead frame connector and an interposer connector 328, said at least one contact pad being formed on said top side of said substrate.

8. The apparatus of claim 7, wherein said at least one contact pad 309, 426 has a different metallization than said anode pad and said cathode pad.

9. The apparatus of claim 7, wherein said at least one contact pad 309, 426 has a different thickness than said anode pad and said cathode pad 308, 408.

10. The apparatus of claim 7, further comprising an anti-corrosion lubricant located on at least a portion of said at least one contact pad 309, 426.

11. The apparatus of claim 7, wherein said at least one contact pad 309, 426 has metallization identical to that of said anode pad and said cathode pad.

12. The apparatus of claim 1, wherein said substrate 222 comprises an electrically conductive material with an electrically insulating layer 220 thereon, said electrically insulating layer forming said top side of said substrate.

13. The apparatus of claim 1, further comprising a thermal interface between said heat transfer element and said substrate.

14. The apparatus of claim 13, wherein said thermal interface comprises a liquid metal thermal interface, and wherein adjacent portions of said heat transfer element and said substrate are metallized to provide wetting for said liquid metal thermal interface.

15. A system comprising;
  a concentrating lens; and
  an assembly comprising:
    a mechanically stable flat substrate having a top side and a bottom side;
    a metallization layer formed on said top side of said mechanically stable flat substrate;
    a solar cell attached to said top side of said mechanically stable flat substrate via said metallization layer;
    a heat transfer element secured to said bottom side of said mechanically stable flat substrate;
    an anode pad formed on said top side of said mechanically stable flat substrate as part of said metallization layer and coupled to said solar cell; and
    a cathode pad formed on said top side of said mechanically stable flat substrate as part of said metallization layer and coupled to said solar cell;
  wherein:
    said mechanically stable flat substrate has a substrate coefficient of thermal expansion, said solar cell has a solar cell coefficient of thermal expansion, and said substrate coefficient of thermal expansion and said solar cell coefficient of thermal expansion match within plus or minus ten parts per million per degree C.; and
    said assembly and said concentrating lens are cooperatively configured so as to focus solar radiation on said solar cell.

16. The assembly of claim 15, wherein said substrate comprises an electrically insulating material.

17. The assembly of claim 16, wherein said substrate coefficient of thermal expansion is less than ten parts per million per degree C.

18. The assembly of claim 17, wherein said electrically insulating material comprises at least one of aluminum nitride, alumina, silicon nitride, an organic polymer, a particle-impregnated organic polymer, epoxy resin, and silicon dioxide.

19. The assembly of claim 15, wherein said substrate has a thermal conductivity greater than 50 W/m-K.

20. The assembly of claim 15, wherein said substrate 222 comprises an electrically conductive material with an electrically insulating layer 220 thereon, said electrically insulating layer forming said top side of said substrate.

21. The assembly of claim 15, further comprising a thermal interface between said heat transfer element and said substrate.

22. The assembly of claim 21, wherein said thermal interface comprises a liquid metal thermal interface, and wherein adjacent portions of said heat transfer element and said substrate are metallized to provide wetting for said liquid metal thermal interface.

* * * * *